United States Patent
Matayabas, Jr. et al.

(10) Patent No.: US 7,446,360 B2
(45) Date of Patent: Nov. 4, 2008

(54) POLYMER DEVICE WITH A NANOCOMPOSITE BARRIER LAYER

(75) Inventors: James C. Matayabas, Jr., Chandler, AZ (US); Gudbjorg H. Oskarsdottir, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 13 days.

(21) Appl. No.: 10/914,862

(22) Filed: Aug. 9, 2004

(65) Prior Publication Data

US 2006/0027850 A1  Feb. 9, 2006

(51) Int. Cl.
*H01L 35/24* (2006.01)
*H01L 29/76* (2006.01)

(52) U.S. Cl. .................. 257/295; 257/40; 428/421; 428/422; 428/463

(58) Field of Classification Search .......... 257/306, 257/302, 310, 295, 40; 361/504, 505; 428/421, 428/422, 463, 462
See application file for complete search history.

(56) References Cited

U.S. PATENT DOCUMENTS

| | | | |
|---|---|---|---|
| 6,610,223 B2* | 8/2003 | Lee ........................... 264/9 |
| 2002/0090517 A1* | 7/2002 | Zhang et al. ................. 428/421 |
| 2003/0064268 A1* | 4/2003 | Fukuda et al. ................. 429/33 |
| 2003/0090858 A1* | 5/2003 | Waffenschmidt et al. .... 361/504 |
| 2003/0170461 A1* | 9/2003 | Lewiner et al. .............. 428/421 |
| 2004/0242803 A1* | 12/2004 | Ohme et al. ................. 525/400 |
| 2005/0221605 A1* | 10/2005 | Koning et al. ............... 438/623 |

* cited by examiner

*Primary Examiner*—Kenneth Parker
*Assistant Examiner*—Joseph Nguyen
(74) *Attorney, Agent, or Firm*—Blakely, Sokoloff, Taylor & Zafman LLP

(57) ABSTRACT

According to one aspect of the invention, a polymer device and a method of constructing a polymer device are provided. The polymer device includes a first conductor, a second conductor, and a polymeric body between the first and second conductors. The polymeric body includes a polymer material and a phyllosilicate material.

23 Claims, 9 Drawing Sheets

POLYMER DEVICE WITH A NANOCOMPOSITE BARRIER LAYER

BACKGROUND OF THE INVENTION

1). Field of the Invention

Embodiments of this invention relate to a polymer device and a method of constructing a polymer device.

2). Discussion of Related Art

Polymer devices, such as ferroelectric polymer memory chips, like other integrated circuits, are formed on semiconductor wafers. A lower set of electrodes is formed on the insulating layer over which a polymer layer is then deposited. An upper set of electrodes is then formed on the polymer layer. Memory cells are formed in the polymer where the upper electrodes pass over the lower electrodes.

The conductive materials, typically metals, used in the electrodes are highly reactive with the polymer under operating conditions. If polymer and the metals make contact, a chemical reaction may begin under operating conditions which leads to the failure of the device. Additionally, the metal used on the electrodes slowly migrates into the polymer, which increases the difficulty in distinguishing the "1 state" of the memory cells from the "0 state" of the memory cells. It is believed that the degradation arises after repeated use as the capacitance of polymer increases as anions from the electrodes migrate into the polymer.

One solution to preventing the electrodes from contacting the polymer is to form an interface, or barrier layer, between the electrodes and the polymeric layer to prevent such migration and the chemical reaction from taking place. However, the use of typical interface layers a further hampers the performance of the memory cells. Another solution is to use a conductive polymer layer as the interface layer. However, in order for this approach to work, the conductive polymer must be patterned to match the electrodes and at this point there is no way to do so efficiently.

BRIEF DESCRIPTION OF THE DRAWINGS

Embodiments of the invention are described by way of example with reference to the accompanying drawings, wherein.

DETAILED DESCRIPTION OF THE INVENTION

FIG. 1 to FIG. 5 illustrate a polymer device and a method for constructing a polymer device. The polymer device includes a first conductor, a second conductor, and a polymeric body between the first and second conductors. The polymeric body includes a polymer material and a phyllosilicate material. The polymer device may be used in, for example, ferroelectric memory arrays, sensors, and actuators.

FIGS. 1A-1H illustrate a process of making a polymer device that may be used in a ferroelectric polymer memory array. It should be understood that FIGS. 1 to 7 are merely illustrative and may not be drawn to scale.

Figure 1A:
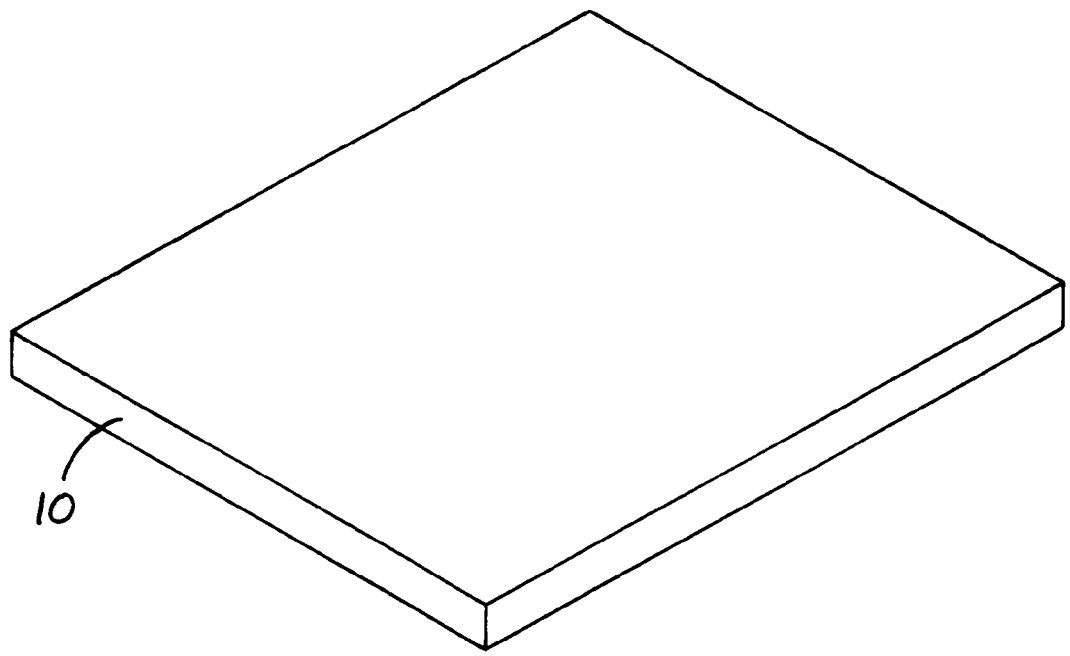
FIG. 1A is a perspective view of a substrate.
Figure 2A:
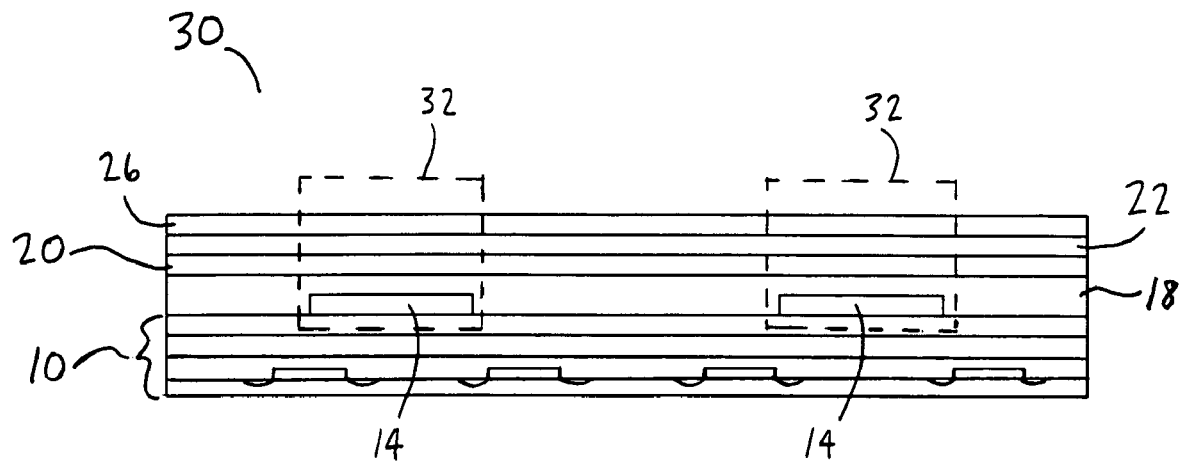
FIG. 2A is a cross-sectional side view on 2-2 in FIG. 1H of the memory array.

FIG. 1A illustrates a semiconductor substrate 10, which is made of silicon and has a thickness of, for example, approximately 1000 microns. Although as illustrated, the substrate 10 appears to be rectangular, it should be understood that the substrate 10 may be only a portion, such as a microelectronic die, of a circular silicon wafer, which typically has a diameter of 200 or 300 millimeters. Referring to FIG. 2A, the substrate 10 has an integrated circuit formed therein which includes a multitude of complimentary metal oxide semiconductor (CMOS) transistors, or other such microelectronic components.

Figure 1B:
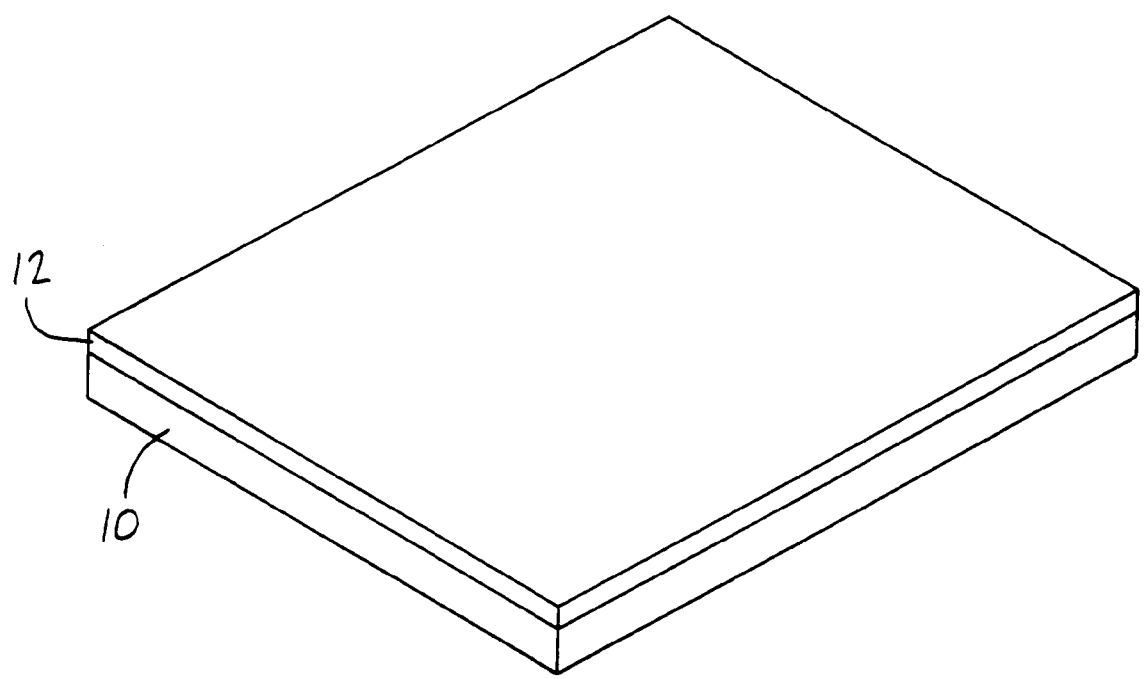
FIG. 1B is a perspective view of the substrate with a first conductive layer formed thereon.

As illustrated in FIG. 1B, a first conductive layer 12 is first formed on the substrate 10. The first conductive layer 12 has a thickness of approximately 750 angstroms and is made of titanium. The first conductive layer 12 is formed using conventional chemical vapor deposition (CVD) techniques.

Figure 1C:
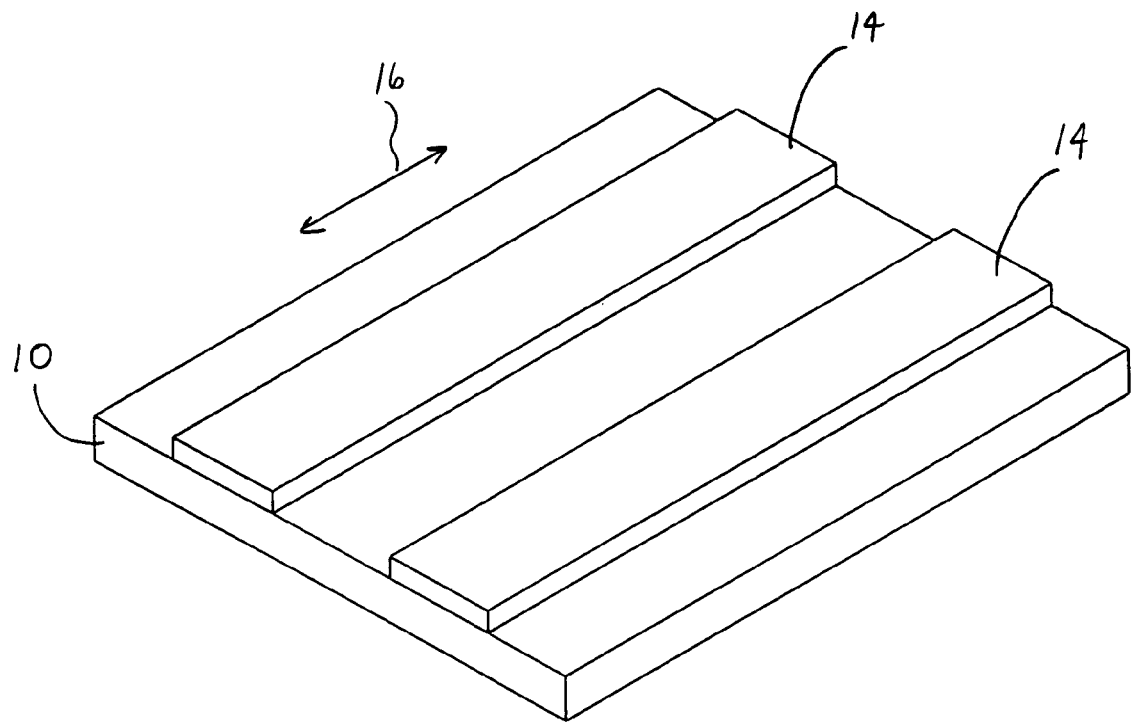
FIG. 1C is a perspective view of the substrate after the first conductive layer has been etched to form lower metal lines.
Figure 1D:
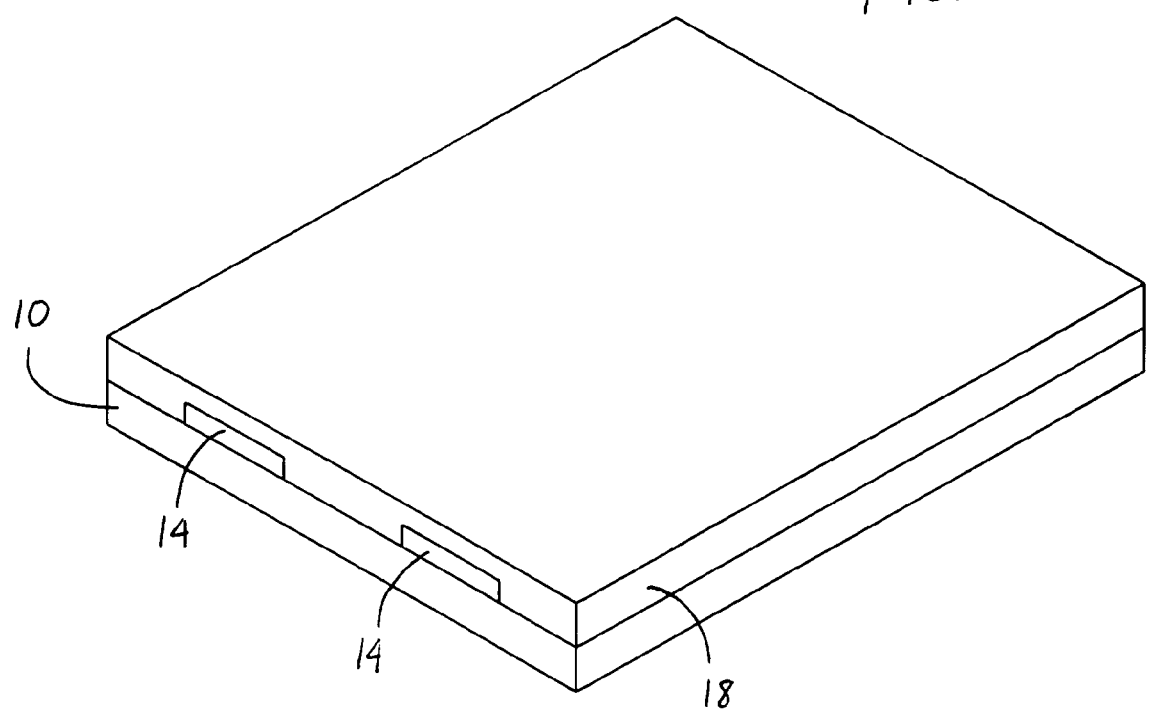
FIG. 1D is a perspective view of the substrate with a first nanocomposite barrier layer formed over the lower metal lines.

Referring to FIG. 1C, the first conductive layer 12 then undergoes a conventional photolithography, such as masking a layer of photoresist on an upper surface thereof and exposing the layer, and etch process, leaving behind the lower metal lines 14. The lower metal lines 14 have a width of 0.75 micron and extend in a first direction 16. The lower metal lines 14 lie on a central portion of the substrate 10 and are separated by a distance of 0.75 micron. Although not illustrated in detail, it should be understood that the lower metal lines 14 are electrically connected to the integrated circuit within the substrate 10.

As illustrated in 1D, a first nanocomposite barrier layer 18 is then formed over the lower metal lines 14. The first nanocomposite barrier layer 18 is preferably formed of a natural phyllosilicate material, such as sodium montmorillonite, and has a thickness of approximately 1000 microns.

Other phyllosicate materials may be used including other natural phyllosicates, such as saponite, hectorite, mica, vermiculite, bentonite, nontronite, beidellite, volkonskoite, magadite, and kenyaite. Synthetic phyllosicates may also be used, such as synthetic mica, synthetic saponite, and synthetic hectorite. Modified phyllosicates ("clays") may also be used such as fluorinated montmorillonite, fluorinated mica, and fluorinated hectorite. Useful phyllosicates are typically swellable, free flowing powders having a cation exchange capacity from approximately 0.3 to approximately 3.0 milliequivalents per gram of mineral (meq/g), and preferably from approximately 0.9 to approximately 1.5 meq/g. The phyllosicates may comprise a wide variety of cations, including class IA and IIA elements, such as sodium and lithium, and cations of group IV elements, such as ammonium and phosphonium cations (or molecules).

The nanocomposite barrier layer 18 is formed using spin coating, which includes mixing the phyllosicate material into a solvent in which the phyllosicate material is considerably soluble and depositing the mixture onto the substrate (or wafer) while the substrate is being spun. As the wafer spins, excess material is removed to leave the thickness phyllosicate material substantially uniform. Further heating of the wafer will evaporate the remaining solvent. This heating step may be avoided depending on the solvent used.

Figure 1E:
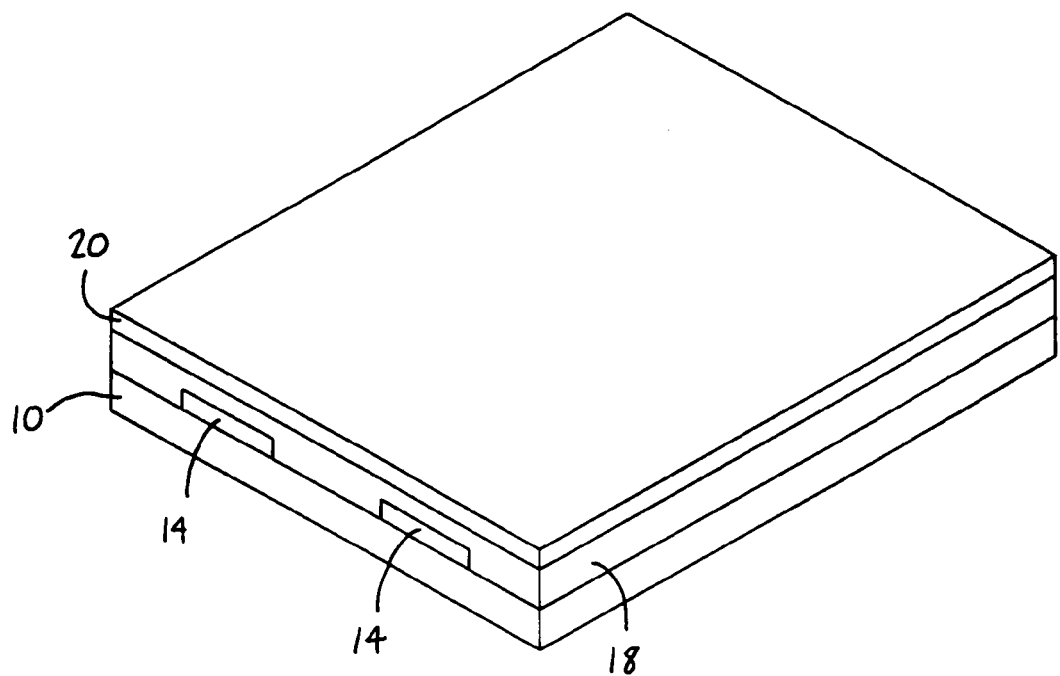
FIG. 1E is a perspective view of the substrate with a polymer layer formed over the first nanocomposite barrier layer.

Next, as illustrated in FIG. 1E, a ferroelectric polymer layer 20 is formed over the first nanocomposite barrier layer 18. The ferroelectric polymer layer 20 is preferably made of polyvinylidine fluoride and has a thickness of approximately 1000 angstroms.

Useful ferroelectric polymers are typically fluorinated hydrocarbons having a high concentration of carbon atoms with only one fluoride atom attached. Other ferroelectric polymers include polyfluoroethylene, poly(2,3-difluoro-1,4-benzene), poly(2,3-difluoro-1,4-benzyl ether), poly(1,2-difluoroethyl), and the like, the copolymers, and the mixtures of the above-mentioned polymers.

The ferroelectric polymer layer 20 is formed using a spin coating process similar to the one discussed above.

Figure 1F:
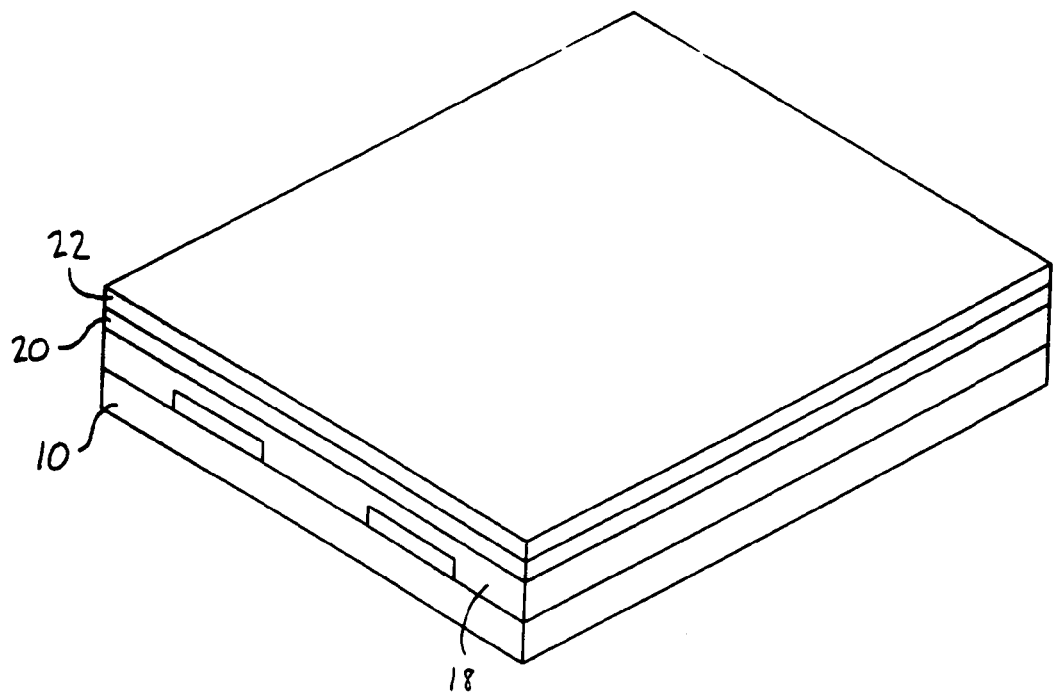
FIG. 1F is a perspective view of the substrate with a second nanocomposite barrier layer formed over the polymer layer.

Referring to FIG. 1F, a second nanocomposite barrier layer 22 is then formed over the ferroelectric polymer layer 20. The second nanocomposite barrier layer 22 is made of the same materials and according to the same processes as the first nancomposiste barrier 18 layer discussed above. The second nanocomposite barrier layer 22 has a thickness similar to the first nancomposite barrier layer 18.

Figure 1G:
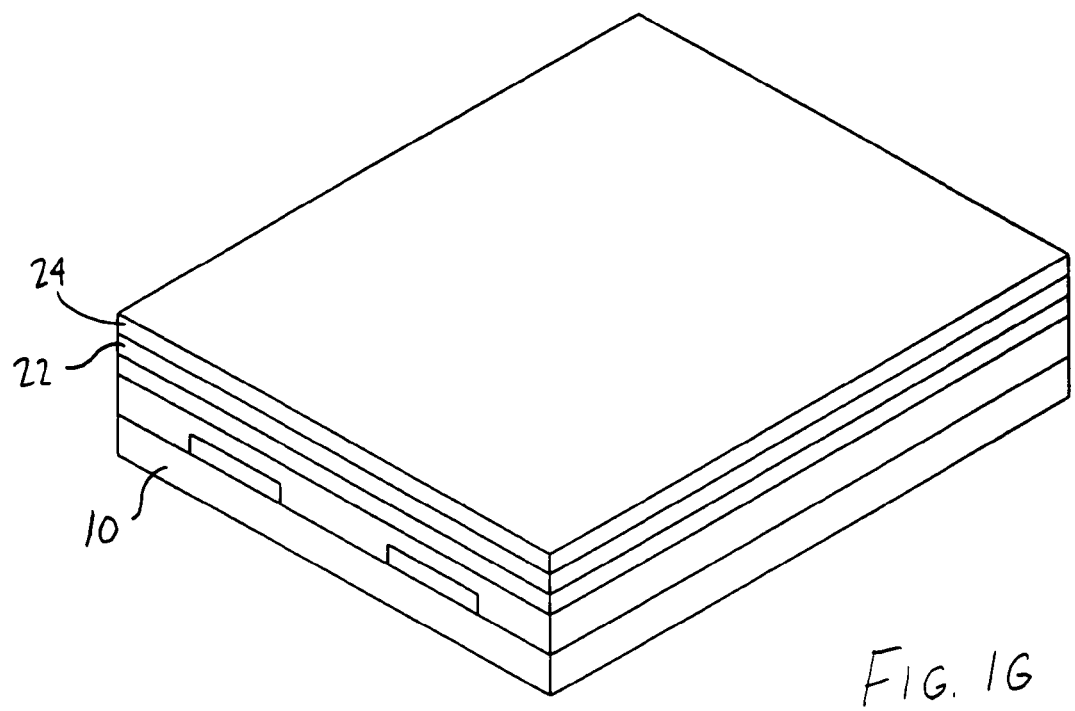
FIG. 1G is a perspective view of the substrate with a second metal layer formed over the second nanocomposite barrier layer.

Next, as illustrated in FIG. 1G, a second conductive layer 24 is formed over the second nanocomposite barrier layer 22. The second conductive layer 24, similar to the first conductive layer 12, is made of titanium, has a thickness of 750 angstroms, and is formed using CVD techniques.

Figure 1H:
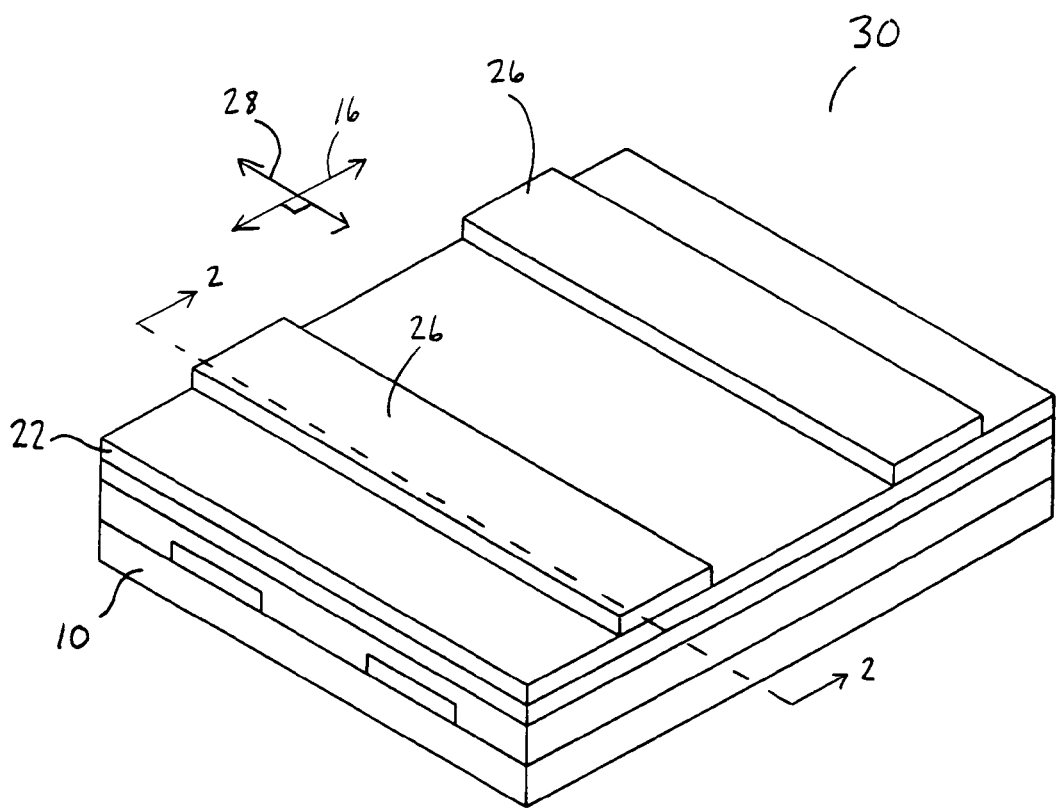
FIG. 1H is a perspective view of the substrate after the second conductive layer has been etched to form lower metal lines, thus forming a memory array including four memory cells.

Referring to FIG. 1H, the second conductive layer 24 then undergoes a conventional photolithography, such as masking a layer of photoresist on an upper surface thereof and exposing the layer, and etch process, leaving behind upper metal lines 26. The upper metal lines 26 have a width of 0.75 micron and extend in a second direction 28 that is perpendicular to the first direction 16. The upper metal lines 26 lie on a central portion of the second nanocomposite barrier layer 22 and are separated by a distance of 0.75 micron. Although not illustrated in detail, it should be understood that the upper metal lines 26 are electrically connected to the integrated circuit within the substrate 10.

FIG. 1H illustrates a completed ferroelectric polymer memory array 30, which contains four polymer devices, ferroelectric cells, or memory cells.

FIG. 2A illustrates two memory cells 32 of the memory array 30. Each upper metal line 26 crosses over both lower metal lines 14. Each memory cell 32 is formed by sections, or portions, of the upper 26 and the lower 14 metal lines, which directly oppose each other with a section of the first nanocomposite barrier layer 18, the ferroelectric polymer layer 20, and the second nanocomposite barrier 22 lying between. The sections of the first nanocomposite barrier layer 18, the ferroelectric polymer layer 20, and the second nanocomposite barrier layer 22 jointly form a polymeric body between the respective metals lines 26 and 14.

Figure 2B:
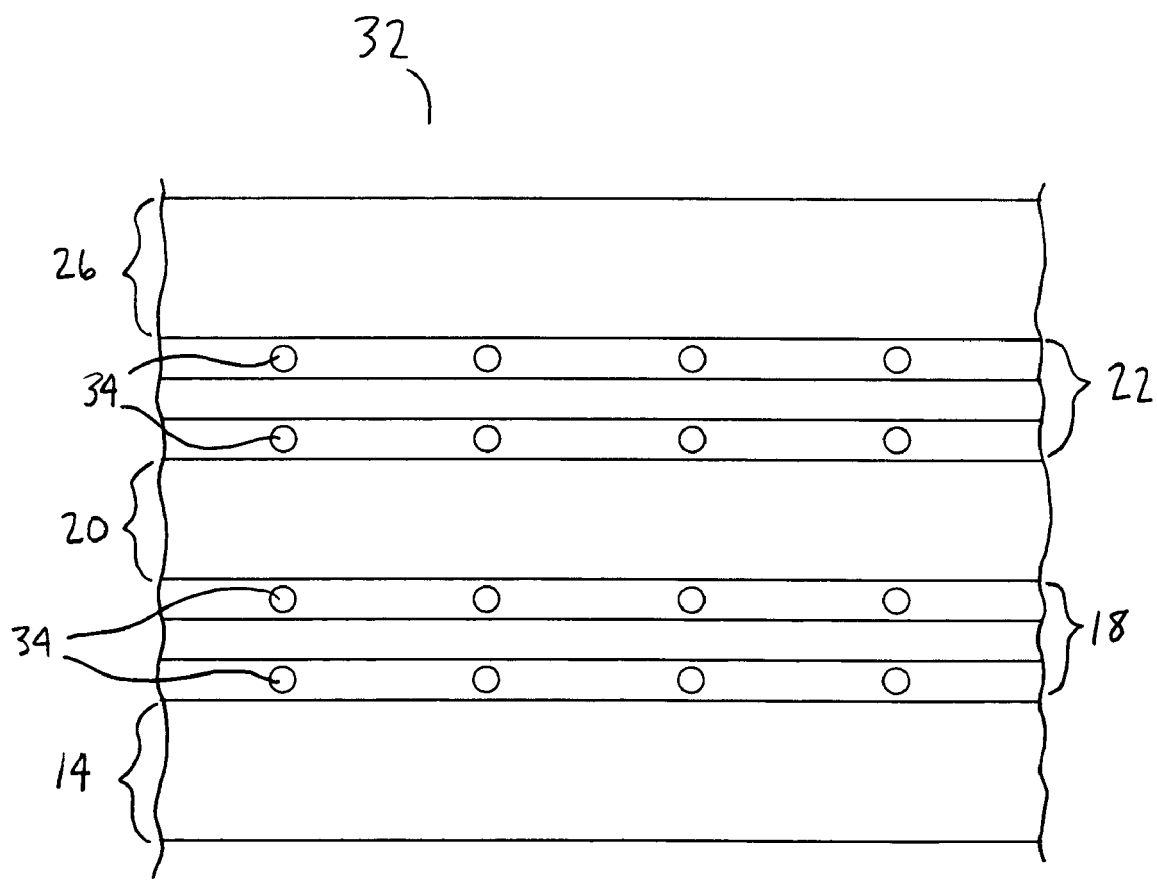
FIG. 2B is a cross-sectional side view of one of the memory cells.

FIG. 2B illustrates one of the memory cells 32 in greater detail. The first nanocomposite barrier layer 18 and the second nanocomposite barrier layer 22 include a plurality of cations 34. As illustrated in FIG. 2B, while the memory array 32 is not in use, an equal number of cations 34 are in each of the barrier layers 18 and 22 on opposing sides of the ferroelectric polymer layer 20.

Figure 3:
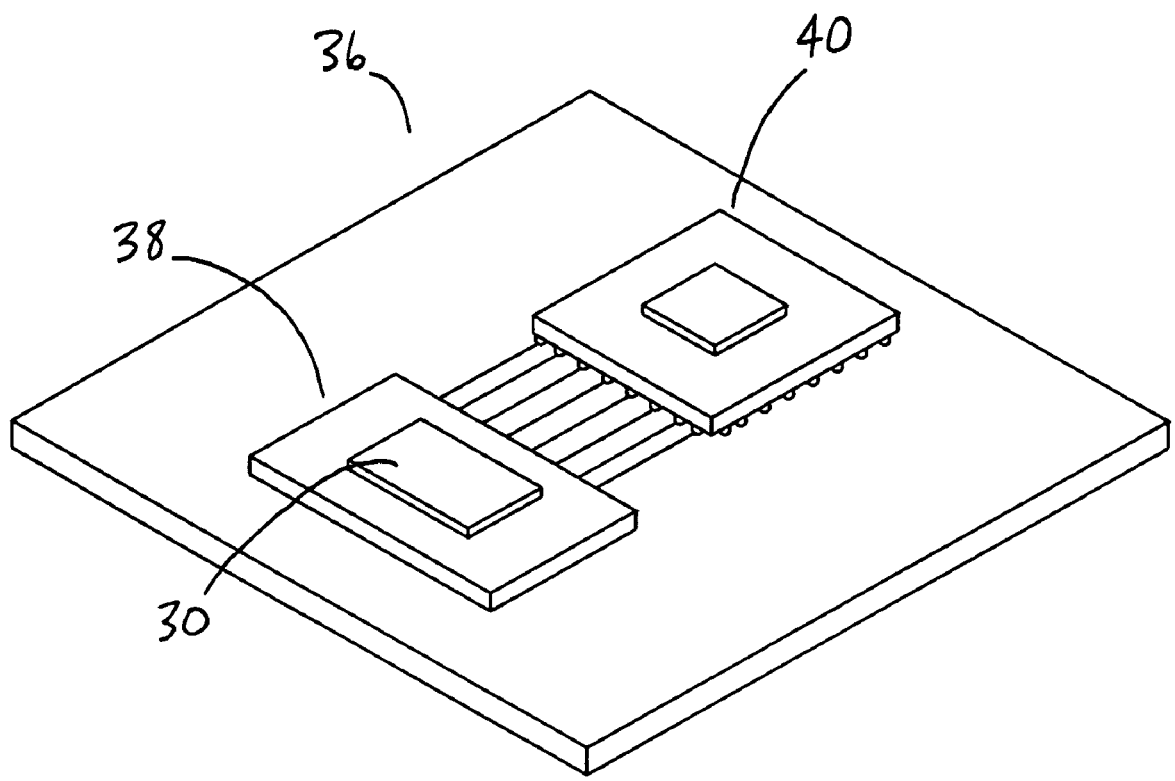
FIG. 3 is a perspective view of a printed circuit board having a microelectronic die, including the memory array of FIG. 1H, attached thereto.

FIG. 3 illustrates a printed circuit board 36, or motherboard, having a memory chip package 38 and a microprocessor package 40 attached thereto. The motherboard 36 is a large substrate having a plurality of sockets for securing and providing electric signals to the packages, microelectronic dice, and other electronic devices, as well as conductive traces to electrically connect such devices, as is commonly understood in the art.

The memory chip package 38 includes a memory die, including the memory array 30, and a memory package substrate. After formation of the memory array 30, the wafer is singulated into separate microelectronic dice, each with a respective memory array 30 formed thereon. Although not illustrated, the memory package substrate includes a plurality of electrical contacts to electrically connect the memory die to the motherboard 36. The memory package substrate has alternating conducting and insulating layers therein, as is commonly understood in the art.

The microprocessor package 40 includes an additional package substrate with a microprocessor die mounted thereon which is electrically connected to the motherboard 36 through the package substrate.

Figure 4A:
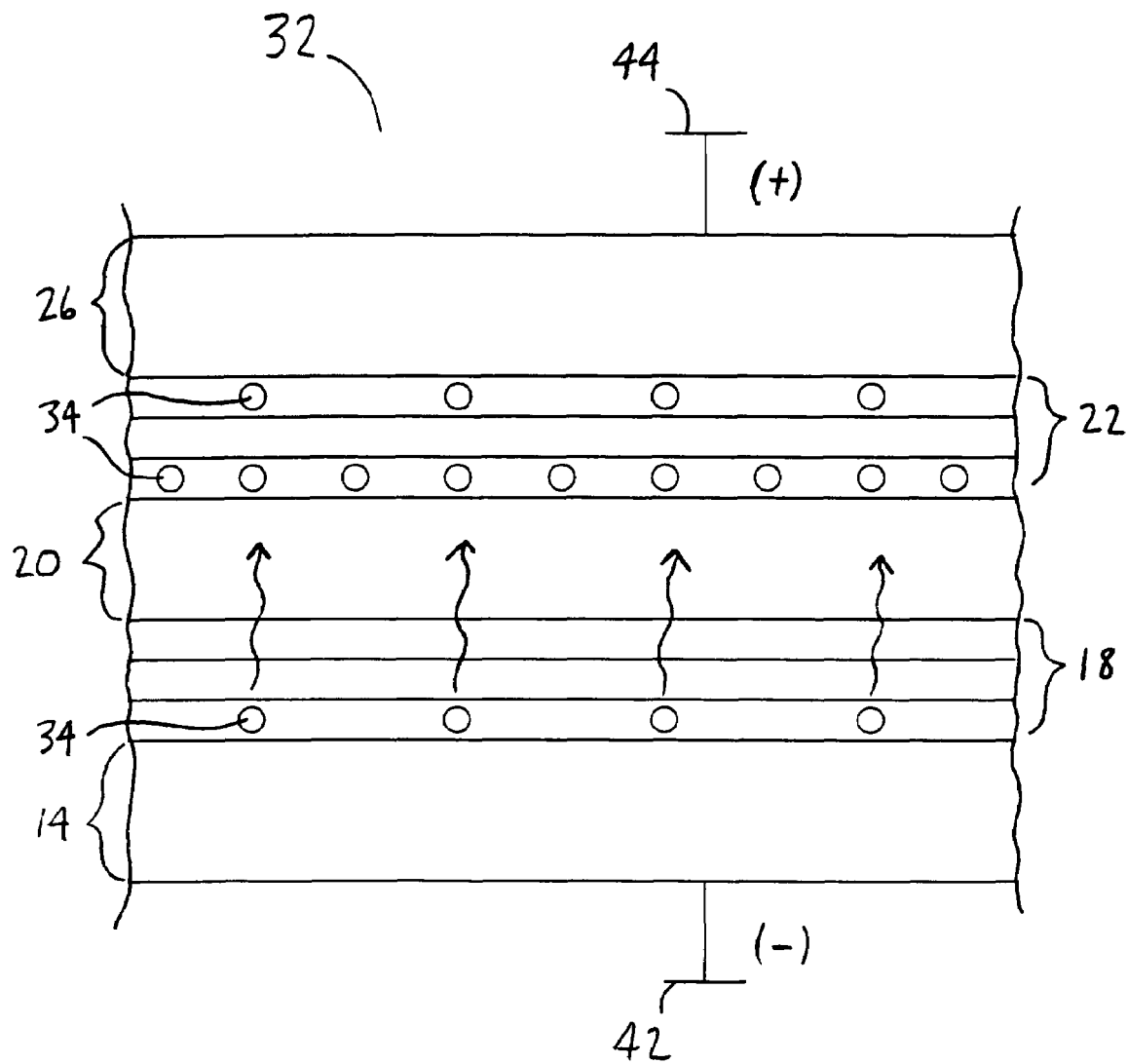
FIGS. 4A and 4B are cross-sectional sides views of the memory cell of FIG. 2B illustrating how the memory array is used.
Figure 4B:
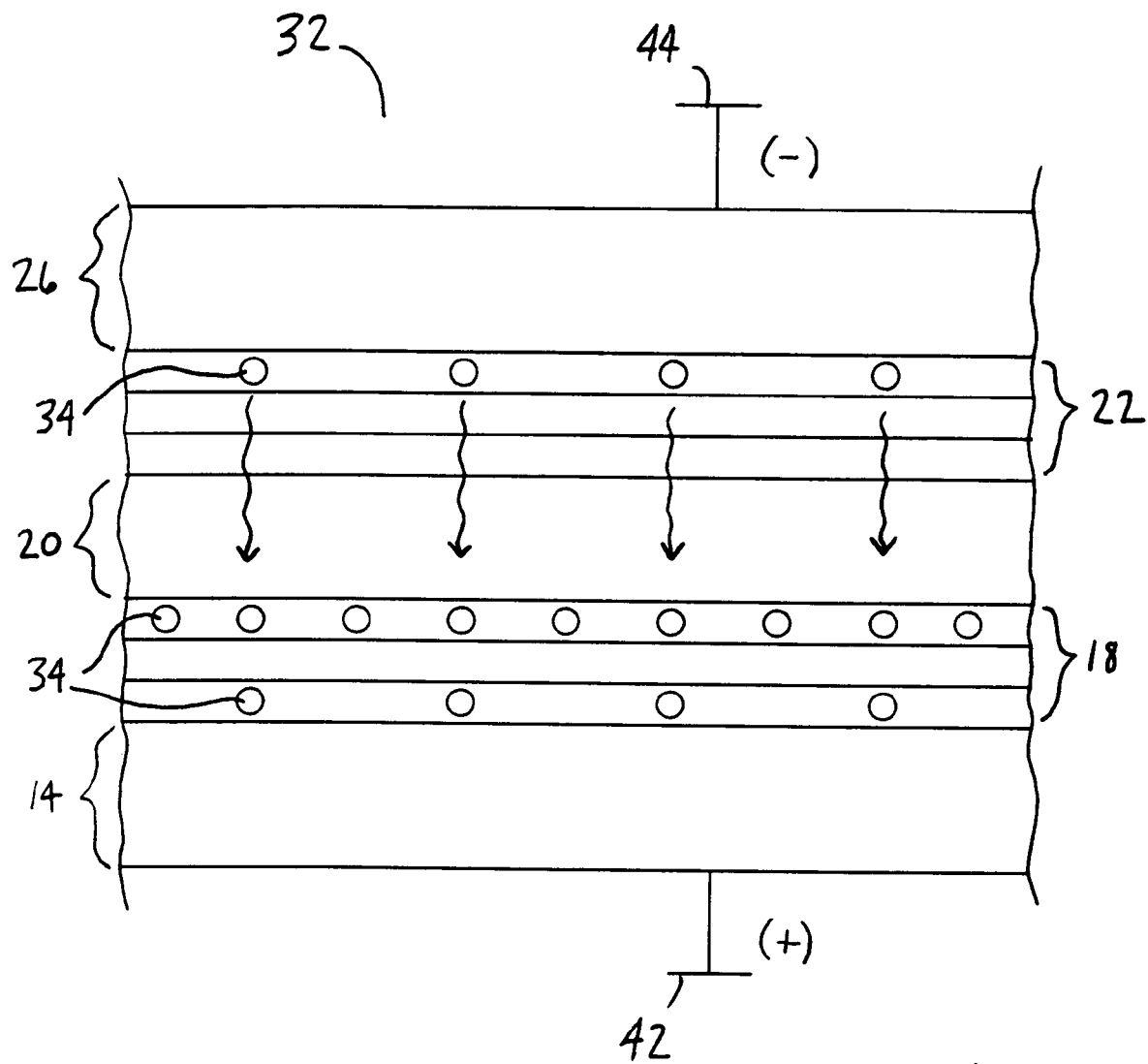
Figure 5:
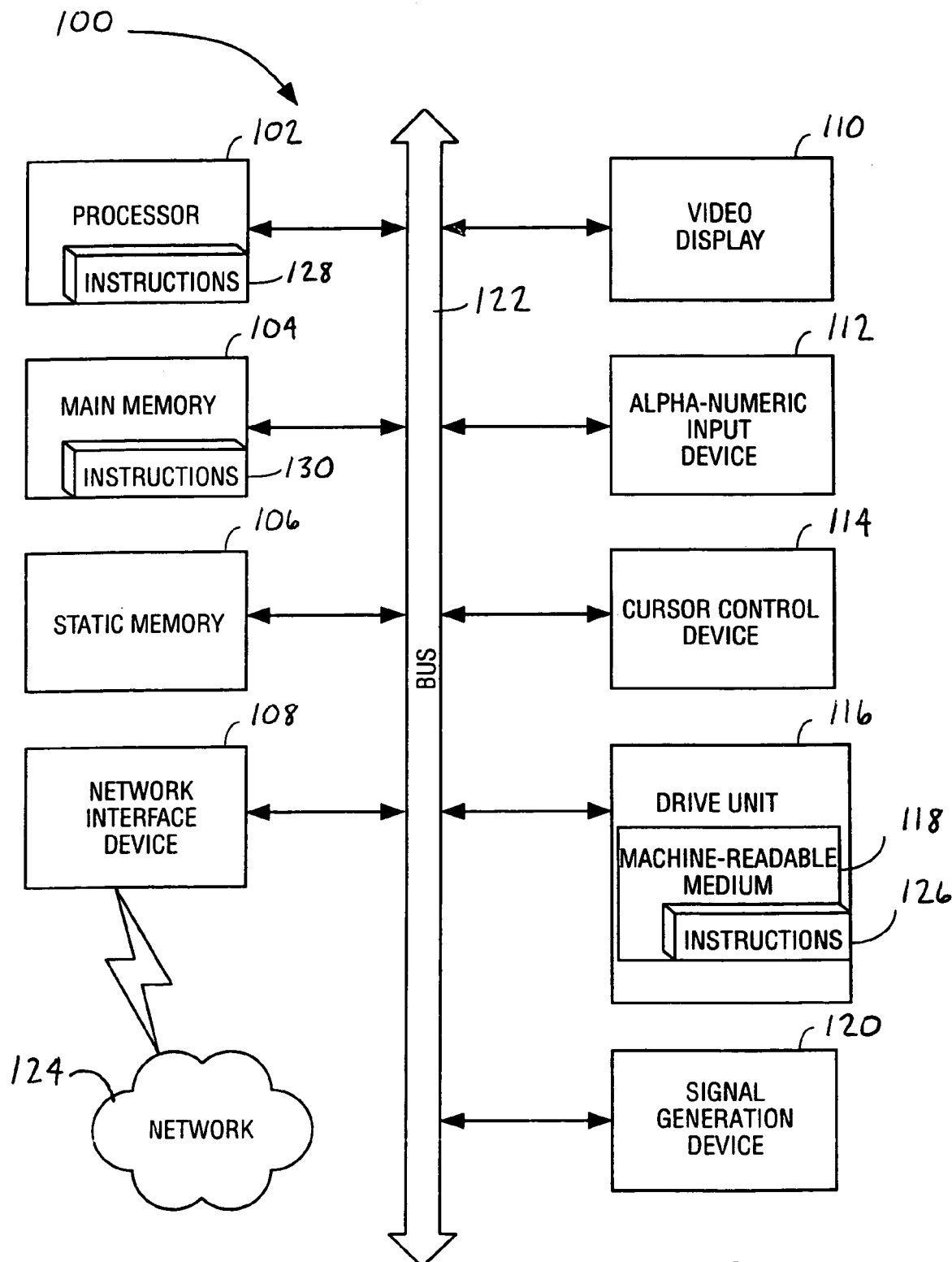
FIG. 5 is a block diagram of a computing system.

As shown schematically in FIGS. 4A and 4B, when the memory array 30 is attached to the motherboard 36 through the memory package substrate, and the motherboard 36 is installed in a computing system, the lower metal line 14 of acts as a lower conductive electrode and is connected to a first electric terminal 42. The upper metal line 26 is an upper conductive electrode and is connected to a second electric terminal 44.

In use, referring specifically to FIG. 4A, signals are sent to the memory array 30, in particular each memory cell 32, through the motherboard 36. A first voltage is applied across the first 42 and second 44 electric terminals, with the first terminal 42 having a negative charge and the second terminal 44 having a positive charge. The first voltage causes dipoles contained in the ferroelectric polymer 20 to align in a particular orientation, or polarity. Because the cations 34 are positively charged, many of the cations 34 migrate from the lower metal lines 14, through the ferroelectric polymer layer 20, into the upper metal lines 26. After the first voltage is released from the first 42 and second 44 electric terminals, the cell 32, including the polymer 20 and the barrier 18 and 22 layers, retain the orientation of the dipoles therein, and thus the cell 32 maintains the polarity.

Referring to FIG. 4B, a second voltage, of an opposite polarity, is then applied across the first 42 and second 44 electric terminals to reverse the orientation, and therefore the charge, of the dipoles within the polymer 20. As illustrated, because the cations 34 are positively charged, many of the cations 34 migrate from the upper metal lines 26, through the ferroelectric polymer layer 20, into the lower metal lines 14. After the second voltage is released, the cell 32 retains the polarity as induced by the second voltage.

The presence or absence of a particular charge in one of the cells 32 may be used to store either a 0 or a 1 of a memory bit. Other electric signals may be sent through the first 42 and second 44 electric terminals to detect the charge of the polymer 20 and thus read the memory of the bit of information.

One advantage is because of the ability of the nanocomposite barrier layers to reduce metal migration from the electrodes, the reliability of the memory cells is improved. Another advantage is that the nanocomposite barrier layers provide stabilizing charges and sufficient short range mobility, namely of cations, thus improving the performance of the memory cells. Another advantage is that the nanocomposite barrier layers provide improved mechanical properties and adhesion of the ferroelectric polymer to the electrodes thereby further improving the reliability of the memory cells. A further advantage is that because the nanocomposite barrier layer separates the polymer layer from the electrodes, the polymer layer and the electrodes do not make contact and no damaging chemical reactions takes place thereby even further improving the reliability and longevity of the memory cells.

Although the embodiment shown contains only two layers of metal lines and one layer of polymer, it should be understood that the number of levels of the memory array may be increased to "stack" memory cells on top of one another.

Although not discussed in detail above, the materials used to make the polymeric body between the electrodes also have piezoelectric properties which could be used to detect changes in pressure or to activate another device when pressure is applied. Thus, other embodiments may use the polymer devices, or ferroelectric cells, with the phyllosilicate material, in devices besides memory arrays, such as ferroelectric sensors and actuators, as is commonly understood in the art.

Different materials may be used to form the electrodes, such as gold and vanadium. Other methods may be used to form the various layers of the memory array 20 such as thermal evaporation, plating, CVD, and ion beam sputtering.

The nanocomposite barrier may be mixed with a binder material for filling in gaps between the phyllosilicate platelet particles and providing a uniform film. The binder may be the same or different from the ferroelectric polymer. Examples of useful binding materials include conductive polymers such as Pedot, holt melt adhesives such as AQ-55, waxes such as maleated polypropylene, water dispersible polymers such as ethylene vinyl alcohol (EVOH) and methyl cellulose, and combinations thereof.

Although as illustrated in FIGS. 1A-4B, the nanocomposite material is shown as being within a layer separate from the polymer, or ferroelectric material, the nanocomposite material may be mixed with the ferroelectric material so that a single-layered polymeric body lies between the electrodes. The nanocomposite material may be added to the ferroelectric material before, during, or after polymerization. The nanocomposite material may be added using a solvent or a carrier gas. The nanocomposite material may also be dissolved into the polymer at elevated temperatures such as by melt mixing or extrusion blending. The nanocomposite material may be added before, during, or after formation of the polymer film by methods known in the art, such as spray coating, printing, casting, extruding, vapor deposition, spin coating, and Langmuir Blodget.

If desired, the film may be further treated to achieve a high degree of order by methods including stretching (axial or biaxial), drawing, annealing, poling, and the like, or combinations thereof. One way of incorporating the nanocomposite material into the polymer is to disperse the nanocomposite material into a solution of the ferroelectric polymer and casting the material into a film on the substrate. When the nanocomposite material is dispersed into the ferroelectric material, it is desirable that the ferroelectric polymer intercalate or exfoliate the nanocomposite material so that the ferroelectric material lies between the platelet particles of the phyllosilicate material.

The discrete layers of the phyllosilicate material, similar to those illustrated in FIGS. 1A-4B, may be used in combination with the ferroelectric material having been mixed with the phyllosilicate material described above, along with the binder materials described above.

Other additives, such as dopants, electron acceptors, and salts, may also be added to further enhance performance and reliability.

FIG. 7 illustrates a computing system 100 into which the memory arrays, dice, packages, and printed circuit boards described above may be installed. The computing system includes a processor 102, a main memory 104, a static memory 106, a network interface device 108, a video display 110, an alpha-numeric input device 112, a cursor control device 114, a drive unit 116 including a machine-readable medium 118, and a signal generation device 120. All of the components of the computing system 100 are interconnected by a bus 122. The computing system 100 may be connected to a network 124 through the network interface device 108.

The machine-readable medium 118 includes a set of instructions 126, which may be partially transferred to the processor 102 and the main memory 104 through the bus 122. The processor 102 and the main memory 104 may also have separate internal sets of instructions 128 and 130.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A polymer device comprising:
 a first electrode;
 a second electrode; and
 a polymeric body between the first electrode and the second electrode, the polymeric body comprising a first layer of a polymer material having a first thickness only on top of a second layer of a phyllosilicate material having a second thickness, and a third layer of the phyllosilicate material having a third thickness covering the first layer of the polymer material, the polymeric body maintaining a charge after a voltage is applied across the electrodes, wherein the phyllosilicate material includes a cation, wherein the first electrode is deposited on the third layer of the phyllosilicate material.

2. The device of claim 1, wherein the phyllosilicate material is selected from the group consisting of natural phyllosilicates, synthetic phyllosilicates, and modified phyllosilicates.

3. The device of claim 2, wherein the phyllosilicate material is a natural phyllosilicate selected from the group consisting of montmorillonite, saponite, hectorite, mica, vermiculite, bentonite, nontronite, beidellite, volkonskoite, magadite, and kenyaite.

4. The device of claim 2, wherein the phyllosilicate material is a synthetic phyllosilicate selected from the group consisting of synthetic mica, synthetic saponite, and synthetic hectorite.

5. The device of claim 2, wherein the phyllosilicate material is a modified phyllosilicate selected from the group consisting of fluorinated montmorillonite, fluorinated mica, and fluorinated hectorite.

6. The device of claim 3, wherein the natural phyllosilicate is montmorillonite.

7. The device of claim 1, wherein the phyllosilicate material has a cation exchange capacity of from approximately 0.3 to approximately 3.0 meq/g.

8. The device of claim 7, wherein the phyllosilicate material has a cation exchange capacity of from approximately 0.9 to approximately 1.5 meq/g.

9. The device of claim 1, wherein the cation is selected from the group consisting of class IA elements, class IIA elements, and group IV elements.

10. The device of claim 1, wherein the polymer material comprises at least one of polyvinylidine fluoride, polyfluoroethylene, poly(2,3-difluoro-1,4-benzene), poly(2,3-difluoro-1,4-benzyl ether), poly(1,2-difluoroethyl).

11. An electronic assembly comprising:

a substrate having an integrated circuit formed therein;

a plurality of first conductive lines formed over the substrate, being electrically connected to the integrated circuit, and extending in a first direction;

a polymeric layer formed over the plurality of first conductive lines, the polymeric layer having a plurality of polymeric sections, each polymeric section being over at least a portion of at least one of first conductive lines and comprising a first layer of a polymer material having a first thickness only on top of a second layer of a phyllosilicate material having a second thickness, and a third layer of the phyllosilicate material having a third thickness covering the first layer of the polymer material; and a plurality of second conductive lines formed over the polymeric layer, being electrically connected to the integrated circuit, and extending in a second direction, each second conductive line extending over at least one of the first conductive lines and at least one of the polymeric sections to form a plurality of cells such that each polymeric section maintains a charge after a voltage is applied across the at least one first conductive line and the respective second conductive line, wherein at least the portion of at least one of the second conductive lines is deposited on the third layer of the phyllosilicate material.

12. The electronic assembly of claim 11, wherein the phyllosilicate material is selected from the group consisting of natural phyllosilicates, synthetic phyllosilicates, and modified phyllosilicates.

13. The electronic assembly of claim 12, wherein the phyllosilicate material is a natural phyllosilicate selected from the group consisting of montmorillonite, saponite, hectorite, mica, vermiculite, bentonite, nontronite, beidellite, volkonskoite, magadite, and kenyaite.

14. The electronic assembly of claim 12, wherein the phyllosilicate material is a synthetic phyllosilicate selected from the group consisting of synthetic mica, synthetic saponite, and synthetic hectorite.

15. The electronic assembly of claim 12, wherein the phyllosilicate material is a modified phyllosilicate selected from the group consisting of fluorinated montmorillonite, fluorinated mica, and fluorinated hectorite.

16. The electronic assembly of claim 13, wherein the natural phyllosilicate is montmorillonite.

17. The electronic assembly of claim 12, wherein the phyllosilicate material includes a cation.

18. The electronic assembly of claim 17, wherein the phyllosilicate material has a cation exchange capacity of from approximately 0.3 to approximately 3.0 meq/g.

19. The electronic assembly of claim 18, wherein the phyllosilicate material has a cation exchange capacity of from approximately 0.9 to approximately 1.5 meq/g.

20. The electronic assembly of claim 17, wherein the cation is selected from the group consisting of class IA elements, class IIA elements, and group IV elements.

21. The electronic assembly of claim 11, wherein the polymer material comprises at least one of polyvinylidine fluoride, polyfluoroethylene, poly(2,3-difluoro-1,4-benzene), poly(2,3-difluoro-1,4-benzyl ether), poly(1,2-difluoroethyl).

22. The electronic assembly of claim 11, wherein the substrate is a microelectronic die, and further comprising a printed circuit board, the microelectronic die being attached to the circuit board, and the printed circuit board being electrically connected to a computing system.

23. A polymer device comprising:

a first electrode;

a second electrode; and a polymeric body between the first electrode and the second electrode, the polymeric body comprising a first layer of a polymer material having a first thickness only on top of a second layer of a phyllosilicate material having a second thickness, and a third layer of the phyllosilicate material having a third thickness covering the first layer of the polymer material, the polymeric body maintaining a charge after a voltage is applied across the electrodes, wherein the first electrode is deposited on the third layer of the phyllosilicate material, wherein the polymer material comprises at least one of polyvinylidine fluoride, polyfluoroethylene, poly(2,3-difluoro-1,4-benzene), poly(2,3-difluoro-1,4-benzyl ether), poly(1,2-difluoroethyl).

* * * * *